METHODS OF PRODUCING P-TYPENESS AND P-N JUNCTIONS
IN WIDE BAND GAP SEMICONDUCTOR MATERIALS
Filed Feb. 25, 1971
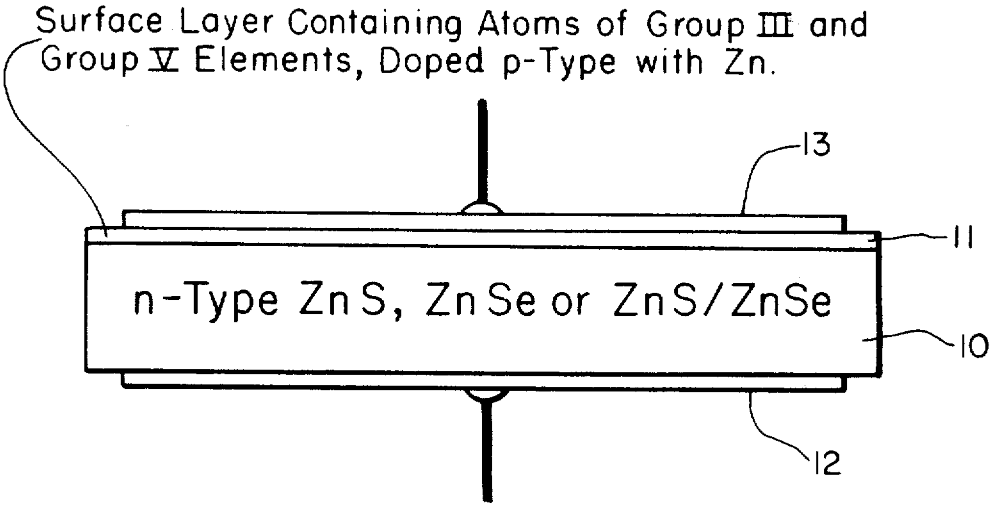
Inventor
Zoltan K. Kun
By
Attorney 3,705,059

METHODS OF PRODUCING P-TYPENESS AND P-N JUNCTIONS IN WIDE BAND GAP SEMICONDUCTOR MATERIALS

Zoltan K. Kun, Skokie, Ill., assignor to Zenith Radio Corporation, Chicago, Ill.

Continuation-in-part of abandoned application Ser. No. 819,960, Apr. 28, 1969. This application Feb. 25, 1971, Ser. No. 118,744
Int. Cl. H01l *7/36, 5/00;* C23c *13/00*
U.S. Cl. 148—175 15 Claims

ABSTRACT OF THE DISCLOSURE

To produce a p-conductivity type wide band gap semiconductor material, a III–V compound semiconductor layer is first vacuum evaporated onto and then diffused into a crystalline II–VI compound semiconductor substrate, specifically a zinc chalcogenide. The resulting hybrid crystalline material is doped by simultaneous or sequential infusion of zinc atoms in substitution for atoms of the Group III element. The process may be used for the direct production of p-n junctions in zinc chalogenides by employing an n-type rather than an intrinsic substrate.

RELATED APPLICATION

This application is a continuation-in-part of application Ser. No. 819,960, filed Apr. 28, 1969, now abandoned, by the present applicant for Methods of Producing P-Type Wide Band Gap Semiconductor Materials, and assigned to the same assignee as the present application.

BACKGROUND OF THE INVENTION

This invention relates to the production of wide band gap p-type semiconductor crystalline materials and more particularly to the production of such materials having an energy band gap in the visible light spectrum. The invention also pertains to p-n junction devices comprising II–VI semiconductor materials, and to methods of making such devices.

Semiconductor diode light sources operating in both spontaneous emission or stimulated emission modes are known in the art, but such known devices have operated only at low efficiencies and longer wavelengths. To provide for visible light emission at higher efficiencies and at short wavelengths, wider band gaps and higher radiative efficiency materials are required. Certain II–VI compounds, in particular most of the zinc and cadmium chalcogenides, have the requisite wide band gaps but have not been amenable to shallow acceptor doping and it has therefore not been feasible to produce useful, if any, PN junctions in such II–VI materials. The normal acceptors for the II–VI compounds are Group I and Group V elements which are deep level acceptors, so that high conductivity p-type doping has not been possible.

With the exception of zinc telluride, which occurs as a p-type semiconductor naturally and is not amenable to high conductivity n-type doping, and cadmium telluride which can be doped either n- or p-type but has too narrow a band gap for visible emission, the binary II–VI compound semiconductor materials tend to be naturally n-type (or in the case of zinc sulfide high resistivity) and are not susceptible to high conductivity p-type doping by conventional methods. It has been reported that mixed crystals of zinc selenide and zinc telluride in approximately equal proportions may be doped either n-type or p-type as desired by the use of conventional dopants and doping methods, but carrier concentrations are apparently limited to the order of $10^{14}$ or $10^{15}$ carriers per cubic centimeter at room temperature for p-doped materials, and the band gap is not sufficiently wide to permit radiative transitions at the short or intermediate visible wavelengths. Even more recently than the present invention, successful p-type doping of cadmium sulfide by ion implantation of bismuth atoms has been reported, but such ion implantation is apt to produce undesirable lattice distortions, and again the room temperature conductivities obtained have been much lower than desired. Prior attempts to produce stable p-type wide band gap zinc chalcogenides, particularly zinc sulfide, zinc selenide or a zinc sulfoselenide, with sufficient acceptor concentrations have been totally unsuccessful.

In the application of Robert J. Robinson, Ser. No. 661,866, filed Aug. 21, 1967, for Solid State Light Sources, now Pat. No. 3,496,429, issued Feb. 17, 1970, and assigned to the present assignee, there are disclosed and claimed as a new class of hybrid materials exhibiting the wide energy band gaps characteristic of the II–VI compounds and producible with either n-type or p-type conductivity. These hybrids are composed of binary, ternary or quaternary alloys or solid solutions of one or more II–VI compounds with at least one compound semiconductor comprising Group III atoms in a trivalent state. In the preferred materials, the solid solutions are composed of one or more II–VI compounds and one or more III–V compounds. As taught in the Robinson patent, such hybrid materials may be doped to p-type conductivity by substitution of Group II atoms for Group III atoms in the lattice structure of the solid solution. The Robinson patent describes production of the hybrid materials by precipitation from the liquid phase at high temperatures, by halide transport vapor deposition in a closed capsule, or by epitaxial crystal growth processes. The hybrid materials may then be doped to p-type conductivity by diffusing evaporated zinc or cadmium in a closed capsule.

It is a principal object of the present invention to provide a new and improved method of producing wide band gap high conductivity p-type semiconductor materials.

It is a further object of the invention to provide a simple, reproducible and inexpensive method for producing high conductivity p-type semiconductor crystalline materials having an energy band gap in the visible light spectrum.

Another principal object of the invention is to provide a new and improved method of making p-n junctions in wide band gap semiconductor materials.

Still another object of the invention is to provide new and improved p-n junction devices comprising II–VI semiconductor materials.

The method of producing a p-type semiconductor crystalline material having an energy band gap in the visible light spectrum or larger, according to the invention, comprises evaporating a conditioner layer of III–V compound semiconductor onto a non-p-type crystalline II–VI compound semiconductor host substrate, diffusing the evaporated layer into the substrate to convert at least a portion thereof to a hybrid crystalline material whose lattice comprises both the II–VI host compound and the III–V conditioner and doping the hybrid material to p-type conductivity by infusion of atoms of a Group II element into the III–V/II–V hybrid lattice.

The features of the present invention which are believed to be novel are set forth with particularity in the appended claims. The invention, together with further objects and advantages thereof, may best be understood by reference to the following description taken in connection with the accompanying drawing, in which the single figure is a schematic representation of a p-n junction semiconductor device embodying the present invention.

More specifically, the process of the present invention in its preferred application involves the vacuum evaporation onto a properly crystallographically oriented lapped or polished surface of a non-p-type II–VI compound semiconductor substrate, of a III–V compound semiconductor which when used in large concentrations should have a lattice constant which is preferably substantially matched to and in any event compatible with the lattice constant of the II–VI compound semiconductor of the substrate. For example, if zinc sulfide, which has a lattice constant of 5.406 angstroms, is used as the substrate or host crystal, gallium phosphide with a lattice constant of 5.450 angstroms may be employed as the evaporated conditioning layer. With small concentrations of the III–V constituent, in the order of 1% for example, a greater mismatch in lattice constants can be tolerated, and this yields important flexibility in designing materials to optimize p-type conductivity.

The invention is also applicable to the preparation of high conductivity p-type crystalline materials of more complex composition. For example, solid solutions of two or more III–V compound semiconductors in appropriate proportions may be employed as the conditioning material to provide for an improved match between the lattice constants of the substrate and the conditioner. Also, non-p-type mixed crystals or solid solutions of II–VI compound semiconductor materials may be employed as the host substrate, with the energy band gap and therefore the wavelength of the emitted radiation being dependent upon the composition and proportions of the alloy constituents.

After the conditioning material is vacuum evaporated onto the prepared surface of the II–VI compound semiconductor host substrate, it is then diffused into the substrate by heating to a temperature definitely below the melting and disassociation temperatures of the host crystal and preferably below a still lower critical temperature which depends upon the host II–VI compound as well as the particular III–V compound used. Either simultaneously with the diffusion of the evaporated layer into the substrate, or sequentially after the diffusion has been completed, the hybrid crystalline material constituting an alloy or solid solution of III–V and II–VI compound semiconductor materials is doped to p-type conductivity by infusion of atoms of a Group II element into the III–V/II–VI hybrid lattice. Preferably, the Group II dopant is of the same elemental constituency as the cation of the host crystal; that is if zinc sulfide is employed as the II–VI compound host material, doping of the hybrid material is accomplished by infusion of zinc atoms into the hybrid lattice. Doping may be carried out either simultaneously with or subsequently after diffusion of the evaporated conditioning layer into the host substrate, but is preferably accomplished simultaneously by inclusion of the Group II dopant atoms in vapor phase contact with the host crystal during the surface layer diffusion process. The doping mechanism definitely involves substitution of Group II dopant atoms for Group III atoms in the hybrid II–VI/III–V lattice, with the possibility of some interstitial doping and even occasional substitution of Group II dopant atoms for Group VI atoms.

The processing times and temperatures may be varied within certain limits without major effects on the resistivity or on the stability of the resulting p-type hybrid material. By employing the process of the invention, p-type conductivity with specific resistivities in the range from 1 to 100 ohm-centimeters have been prepared, with acceptor carrier concentrations of the order of $10^{17}$ to $10^{19}$ holes per cubic centimeter, several orders of magnitude higher than those yielded with prior art processing of wide band gap semiconductor materials. Moreover, the process yields highly reproducible results and does not require the use of specialized or complex processing apparatus or equipment.

As a specific example of a process embodying the present invention, a lapped and polished slice cut along the basal plane or {00.1} plane from a hexagonal zinc sulfide single crystal is coated to a thickness of about 3000 angstrom units with gallium phosphide by vacuum evaporation. The gallium phosphide coated zinc sulfide substrate is then heated in an evacuated quartz capsule for two hours at 900° centigrade. During this interval, the surface layer of gallium phosphite diffuses into the zinc sulfide substrate, as indicated by a change from the red-orange body color typical of gallium phosphide to a light yellow color. Subsequently, the hybride material is heated in zinc vapor at 750° centigrade for one-half hour. The resulting solid solution or mixed crystal material is found to be of p-type conductivity with a specific resistivity, as measured by the four point probe technique, in the range of about 20 ohm-centimeters.

As another example of the inventive process, the gallium phosphide coated zinc sulfide host substrate may be prepared in exactly the same fashion as in the previous example. Diffusion of the gallium phosphide surface layer into the zinc sulfide host crystal and doping of the resulting hybrid material may be achieved simultaneously by heating at 900° centigrade in an atmosphere of gallium phosphide and zinc vapor for a period of two hours. The duration of the heating cycle is not critical, and good results have been obtained with processing times from 5 minutes to 16 hours. The composition of the environmental atmosphere for the diffusing and doping process is also not critical but may consist, for example, of 100 milligrams of solid gallium phosphide and 6.8 milligrams of zinc metal for each cubic centimeter of the reaction vessel volume. The temperature is somewhat more critical, it must be maintained definitely below the melting point and below the disassociation temperature of the host crystal and also below a still lower critical temperature which is between 900° and 950° C. for this system.

The process may also be employed to advantage in producing p-n junctions directly by employing an n-type semiconductor substrate material. For example, the host crystal used as a substrate may be an n-type II–VI/III–V hybrid crystalline material of the type described in the above-identified Robinson patent or II–VI crystalline material produced for example in the manner described in the application of Aurelio Catano, Ser. No. 751,385, filed Aug. 9, 1968 for Production of High-Conductivity N-type, ZnSe, ZnS/ZnSe, or ZnSe/ZnTe, now Pat. No. 3,544,468, issued Dec. 1, 1970, and assigned to the present assignee. As applied to such a host crystal, the process of the present invention may be employed to produce a thin surface layer of high p-type conductivity, yielding directly a p-n junction which is current responsive to produce visible light emission.

The foregoing description, modified by amendment of the abstract of disclosure and the addition of specfiic objects addressed to PN junction devices and methods of making them, constitutes essentially the entire text of the specification in the parent application. Since the filing of the parent application, a great deal of experimental work has been conducted and much greater insight has been gained in the technology of the present invention. In particular, while the invention is broadly addressed to attaining p-conductivity in a wide band gap semiconductor material by forming a III–V compound semiconductor conditioner layer onto a crystalline non-p-type II–VI compound semiconductor host substrate, diffusing the conditioner layer into the substrate to convert at least a portion of it into a hybrid crystalline material whose lattice comprises both the II–VI host compound and the III–V conditioner compound, and doping the hybrid material to p-type conductivity by infusion of Group II atoms in the lattice, the full benefits of the invention have only been realized when using a host substrate of a wide band gap zinc chalcogenide (i.e., zinc sulfide, zinc selenide, or zinc sulfo-selenide), when using a phosphide or arsenide of gallium or indium as the III–V conditioner compound, and when using zinc as the final Group II dopant. Moreover, low resistivity p-conductive material has been experimentally obtained only by using small concentrations of the III–V constituent, of the order of 1% or less and preferably in doping concentrations of the order of 0.1% by weight of the hybrid crystalline material. Incidentally, with these small concentrations, it has been found that no consideration need be given to matching of the respective lattice constants of the conditioner in the host compound; indeed, it is preferred to use such a small amount of the III–V conditioner layer that diffusion of the III–V conditioner layer into the host crystal to provide the p-type convertible layer produces no measurable change in the lattice constant of the substrate, and no detectable change in the band absorption edge.

A p-n junction semiconductor device made according to the present invention is shown in the accompanying drawing, which illustrates a low resistivity (of the order of 0.1 to 1.0 ohm centimeter) of zinc selenide, zinc sulfide or a zinc sulfo-selenide which has been doped n-type using iodine or other halogen donor in the presence of zinc in accordance with the teaching of the above-identified Catano patent. The device further comprises a surface layer 11 of p-type material formed by vacuum evaporating a small amount of the conditioner layer of a phosphide or arsenide of gallium or indium onto the surface of the host crystal, diffusing the conditioner layer into the surface of the host crystal, and doping the in-diffused surface layer p-type by substitution of zinc atoms for gallium or indium in the surface layer 11. Ohmic contacts 12 and 13 are provided on the exposed surfaces of the substrate 10 and the p-type surface layer 11, respectively, to permit application of an energizing current which causes visible light edge emission from the n-side of the junction.

While particular embodiments of the invention have been described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. The method of producing p-type semiconductor crystalline material having an energy band gap in the visible light spectrum, which method comprises:
- in an inert environment, evaporating a III–V compound semiconductor conditioner layer onto a crystalline non-p-type II–VI compound semiconductor host substrate;
- diffusing said layer into said substrate to convert at least a portion thereof to a hybrid crystalline material whose lattice comprises both said II–VI host compound and said III–V conditioner compound;
- and doping said hybrid material to p-type conductivity by infusion of Group II atoms in said lattice.

2. The method of claim 1, in which said doping step is achieved by heating the hybrid material in an atmosphere comprising the Group II dopant and the III–V compound conditioner in vapor phase.

3. The method of claim 1, in which said diffusing of said layer into said substrate and the substitutional doping of the hybrid material are simultaneously achieved by heating, at a temperature below the melting and dissassociation temperatures of the layer and the substrate and below a critical temperature dependent upon materials used, said layer-coated substrate in an atmosphere comprising said Group II atoms in vapor phase.

4. The method of claim 3, in which said layer is formed of a III–V compound semiconductor having a lattice constant compatible with that of said substrate.

5. The method of claim 4, in which the Group II doping atoms are of the same element as the cation of said II–VI compound semiconductor material.

6. The method of claim 5, in which said substrate comprises a chalcogenide of zinc or cadmium.

7. The method of producing a p-type semiconductor crystalline material having an energy band gap in the visible light spectrum, which method comprises:
- vacuum evaporating a III–V compound semiconductor onto a crystalline non-p-type II–VI compound semiconductor substrate:
- heating the coated substrate to convert at least a portion thereof to a hybrid III–V/II–VI material;
- and thereafter doping said hybrid material to p-type conductivity by introduction of Group II atoms therein.

8. The method of claim 7, in which said doping step is achieved by heating the hybrid material in an atmosphere comprising the Group II dopant and the III–V compound conditioner in vapor phase.

9. The method of claim 8, in which said layer is formed of a III–V compound semiconductor having a lattice constant compatible with that of said substrate.

10. The method of claim 9, in which said substrate comprises a chalcogenide of zinc or cadmium.

11. The method of producing a p-type semiconductor crystalline material having an energy band gap in the visible light spectrum, which method comprises:
- providing a crystalline non-p-type II–VI compound semiconductor substrate;
- vacuum evaporating onto a surface of said substrate a III–V compound semiconductor layer;
- heating said layer-coated substrate in an inert atmosphere to diffuse said layer into said substrate and convert at least a portion thereof to a hybrid II–VI/III–V material;
- and thereafter doping said hybrid material to p-type conductivity by substitution of Group II atoms for Group III atoms therein.

12. The method of claim 11, in which said doping step is achieved by heating the hybrid material in an atmosphere comprising the Group II dopant and the III–V compound conditioner in vapor phase.

13. The method of claim 12, in which said substrate comprises a chalcogenide of zinc or cadmium.

14. The method of forming a p-n junction in a wide band gap zinc chalcogenide semiconductor material which comprises:
- providing a high conductivity n-type substrate of zinc sulfide, zinc selenide or a zinc sulfo-selenide;
- conditioning a surface layer of said substrate for conversion to p-type conductivity by in-diffusion of Group III and Group V element atoms;
- and converting said conditioned surface layer to p-type conductivity by doping it with zinc.

15. The method of claim 14 in which said Group III element is gallium or indium and said Group V element is phosphorus or arsenic.

References Cited

UNITED STATES PATENTS

| | | | |
|---|---|---|---|
| 3,104,229 | 9/1963 | Koelmans et al. | 252—501 |
| 3,259,582 | 7/1966 | Folberth | 252—62.3 |
| 3,309,553 | 3/1967 | Kroemer | 317—235 X |
| 3,377,529 | 4/1968 | Weiss | 317—237 |
| 3,459,603 | 8/1969 | Weisberg et al. | 148—1.5 |
| 3,491,004 | 1/1970 | Dijk et al. | 317—234 UX |
| 3,496,024 | 2/1970 | Ruehrwein | 136—89 |
| 3,496,429 | 2/1970 | Robinson | 317—237 |
| 3,544,468 | 12/1970 | Catano | 252—62.3 ZT |
| 3,578,507 | 5/1971 | Chiang et al. | 148—189 X |

L. DEWAYNE RUTLEDGE, Primary Examiner

W. G. SABA, Assistant Examiner

U.S. Cl. X.R.

23—204; 117—106, 201; 136—89; 148—1.5, 174, 187; 252—62.3 ZT, 501; 317—235 R, 237